(12) United States Patent
Joy et al.

(10) Patent No.: US 7,036,712 B2
(45) Date of Patent: May 2, 2006

(54) METHODS TO COUPLE INTEGRATED CIRCUIT PACKAGES TO BONDING PADS HAVING VIAS

(75) Inventors: Stephen C. Joy, Portland, OR (US); Dan Shier, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 10/118,280

(22) Filed: Apr. 8, 2002

(65) Prior Publication Data

US 2002/0108777 A1 Aug. 15, 2002

Related U.S. Application Data

(62) Division of application No. 09/525,399, filed on Mar. 15, 2000, now Pat. No. 6,395,995.

(51) Int. Cl.
*B23K 31/02* (2006.01)

(52) U.S. Cl. ............ 228/248.1; 174/266; 29/852

(58) Field of Classification Search ............ 228/223, 228/224, 248.1, 180.22, 180.21, 39; 174/260–266; 361/767–771; 29/840, 852; 427/282; 428/209
See application file for complete search history.

(56) References Cited

U.S. PATENT DOCUMENTS

| | | | |
|---|---|---|---|
| 4,323,593 A * | 4/1982 | Tsunashima | 427/98.3 |
| 4,610,758 A | 9/1986 | Wilson | 156/656 |
| 5,539,153 A * | 7/1996 | Schwiebert et al. | 174/260 |
| 5,539,181 A | 7/1996 | Sippel | 174/266 |
| 5,541,368 A | 7/1996 | Swamy | 174/266 |
| 5,593,080 A * | 1/1997 | Teshima et al. | 228/39 |
| 5,796,589 A | 8/1998 | Barrow | 361/774 |
| 6,011,695 A | 1/2000 | Dumke | 361/777 |
| 6,386,435 B1 * | 5/2002 | Downes | 228/248.1 |
| 6,599,617 B1 * | 7/2003 | Matsuda | 428/209 |
| 2002/0160165 A1 * | 10/2002 | Matsuda | 428/209 |
| 2002/0185020 A1 * | 12/2002 | Sakai et al. | 101/127 |
| 2004/0092174 A1 * | 5/2004 | Eichorn et al. | 439/876 |

OTHER PUBLICATIONS

Prasad, R.P., "Introduction to Surface Mount Technology", In : *Surface Mount Technology, Principles and Practice*, 2nd Edition , Kluwer Academic Publishers, 47-50, (1997).

* cited by examiner

Primary Examiner—Jonathan Johnson
(74) Attorney, Agent, or Firm—Schwegman, Lundberg, Woessner & Kluth, P.A.

(57) ABSTRACT

The electrical contacts of an integrated circuit package are coupled to printed circuit board bonding pads that include vias having via channels. In one embodiment, a method for fabricating an electronic assembly utilizes a mask having at least one aperture that overlies the bonding pad without substantially overlying the bonding pad's via channel. The aperture can be of any shape, including a circle, ellipse, polygon, or a free-form shape. Solder paste is screened through the mask onto the printed circuit board pads but not the via channels. The electrical contacts of a surface mount technology component such as a ball grid array component can then be affixed to the bonding pads using a reflow soldering technique according to one embodiment.

19 Claims, 4 Drawing Sheets

METHODS TO COUPLE INTEGRATED CIRCUIT PACKAGES TO BONDING PADS HAVING VIAS

This application is a divisional of application U.S. Ser. No. 09/525,399, filed on Mar. 15, 2000, now U.S. Pat. No. 6,395,995.

TECHNICAL FIELD OF THE INVENTION

The inventive subject matter relates generally to electronics packaging. More particularly, the inventive subject matter relates to methods and apparatus to couple the electrical contacts of integrated circuit packages to bonding pads having vias.

BACKGROUND INFORMATION

Integrated circuits (ICs) are typically assembled into packages that are physically and electrically coupled to a substrate such as a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, etc.), and the like.

In the field of electronic systems there is an incessant competitive pressure among manufacturers to drive the performance of their equipment up while driving down production costs. This is particularly true regarding the packaging of ICs on substrates, where each new generation of board-level packaging must provide increased performance while generally being smaller or more compact in size.

A substrate typically includes a number of insulation and metal layers selectively patterned to provide metal interconnect lines (referred to herein as "traces"), and a plurality of electronic components mounted on one or more surfaces of the substrate and functionally interconnected through the traces. The routing traces typically carry signals that are transmitted between the electronic components, such as ICs, of the system. Some ICs have a relatively large number of input/output (I/O) pads. The large number of I/O pads requires a relatively large number of routing traces. Some PCBs require multiple layers of routing traces to accommodate all of the system interconnections.

Routing traces located within different layers are typically connected electrically by vias formed in the board. A via can be made by making a hole through some or all layers of a PCB and then coating or plating the interior hole surface with an electrically conductive material, such as copper or tungsten.

One of the conventional ways of mounting components on a substrate is called surface mount technology (SMT). SMT components have terminations or leads (generally referred to as "electrical contacts") that are soldered directly to the surface of the substrate. SMT components are widely used because of their compact size and simplicity of mounting. One conventional type of SMT component utilizes a ball grid array (BGA) to connect to the substrate. A BGA component has a plurality of solder balls on one surface, each of which represents an electrical contact. Each solder ball connects to a conductor within the component.

The electrical contacts of an SMT component, such as a BGA component, are coupled to corresponding metallized mounting or bonding pads (also referred to herein as "lands") on the surface of the substrate, in order to establish a secure physical connection to the substrate as well as to establish an electrical connection between the SMT component and at least one trace connected to the lands. Ordinarily one land is dedicated to one SMT electrical contact.

Prior to mounting the SMT component on a substrate, the substrate is selectively coated with solder paste, using a mask (also referred to in the art as a stencil or a solder mask stencil) that permits solder paste to coat just the lands. To mount an SMT component to a substrate, the component is carefully positioned or "registered" over the substrate so that its electrical contacts are aligned with the corresponding lands. Finally, the entire package is heated to a temperature that melts the solder balls and the solder paste, so that they physically merge and form proper electrical and physical connections For the reasons stated above, and for other reasons stated below which will become apparent to those skilled in the art upon reading and understanding the present specification, there is a significant need in the art for a method and apparatus for coupling an integrated circuit package to a substrate that offers relatively high density while providing a relatively high quality interconnection.

DETAILED DESCRIPTION

In the following detailed description of embodiments of the invention, reference is made to the accompanying drawings which form a part hereof and in which is shown by way of illustration specific preferred embodiments in which the inventive subject matter may be practiced. These embodiments are described in sufficient detail to enable those skilled in the art to practice them, and it is to be understood that other embodiments may be utilized and tat logical, mechanical and electrical changes may be made without departing from the spirit and scope of the inventive subject matter. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of embodiments of the inventive subject matter is defined only by the appended claims.

Figure 1:
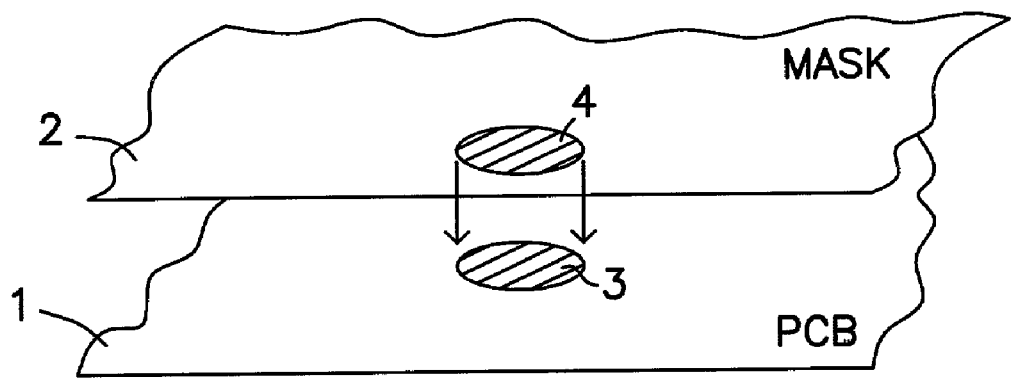
FIG. 1 is a perspective view of a prior art PCB and mask.

FIG. 1 is a perspective view of a prior art PCB 1 and mask 2. PCB 1 has at least one land or bonding pad 3. Land 3 is made of an electrically conductive material such as copper. Mask 2 has an aperture 4 of approximately the same shape and size as land 3. There are commonly a plurality of lands 3 on PCB 1 and a corresponding plurality of apertures 4 in mask 2, but for simplicity of illustration just one of each has been shown in FIG. 1. Aperture 4 of mask 2 is positioned or "registered" directly over land 3, and solder paste is directed through each aperture 4 onto each land 3 but not onto any other part of PCB 1. For the prior art arrangement illustrated in FIG. 1, solder paste is directed onto the entire area of land 3.

Figure 2:
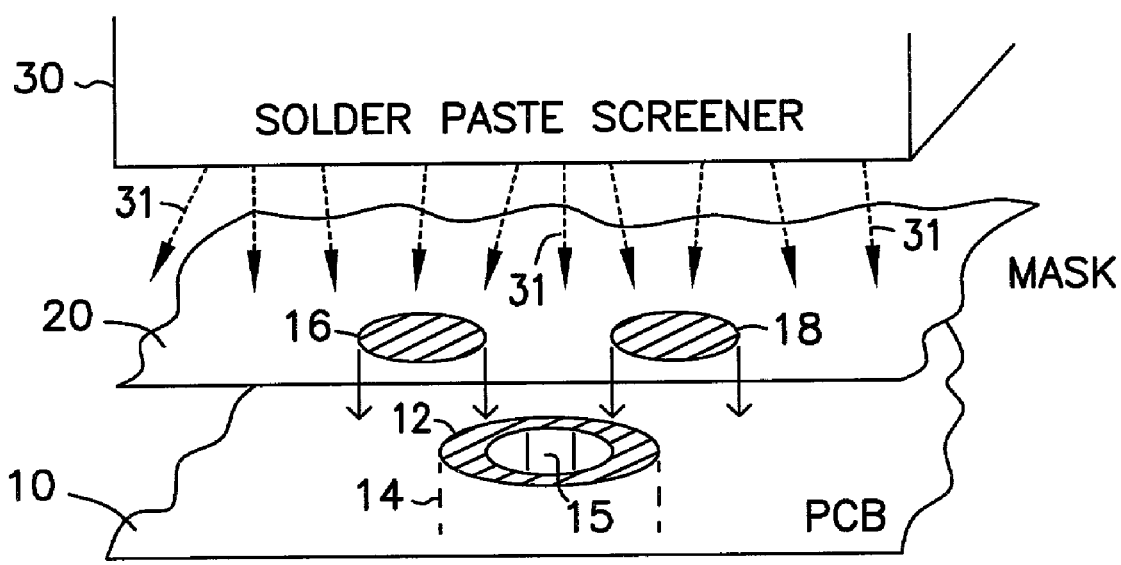
FIG. 2 is a perspective view of apparatus for forming at least one conductive bonding area on a land of a PCB in accordance with one embodiment of the invention.

FIG. 2 is a perspective view of apparatus for forming at least one conductive bonding area 16, 18 on a land 12 of a PCB 10 in accordance with one embodiment of the invention. PCB 10 has at least one land 12. Land 12 is the upper surface of the channel wall of a through-hole or via 14. Although in the IC packaging technology vias can be either solid or hollow, as used herein the term "via" means a hollow via. Via 14 has a hole or channel 15 through it.

Via 14 comprises electrically conductive material, such as copper, that electrically connects circuit traces on different layers (not shown) of PCB 10. Via 14 and its channel 15 can be of any type or cross-section but are typically circular. In the embodiment illustrated in FIG. 2, via 14 is essentially a copper cylinder having a wall of finite thickness that extends partially into PCB 10 (as indicated by the dashed lines) or entirely through PCB 10, depending upon how many layers of the PCB it is required to connect to.

By using the exposed upper surface of via 14 as a land 12, valuable "real estate" is conserved on PCB 10 that would otherwise be separately occupied by via 14 and land 12. When this savings is multiplied by potentially hundreds of via-in-lands on a PCB, the overall savings is considerable, allowing relatively more components to be mounted on a PCB of equivalent size or allowing a PCB with the same number of components to be reduced in size. The resulting electronic system can be manufactured at a lower cost and in a more compact size, and is therefore more commercially attractive.

To avoid deleterious problems that could result if the channel 15 of via 14 is filled with solder, mask 20 comprises at least one aperture 16, 18 that overlies the land 12 but not any substantial portion of channel 15 when mask 20 is properly registered with respect to PCB 10. The aperture 16, 18 has any suitable geometry, such as a circle, ellipse, polygon, multi-sided shape, or free-form shape. In one embodiment, two apertures 16 and 18 are provided in mask 20 for each land 12, one aperture 16 being located on the exposed surface of the wall of via 14 on one side of channel 15, and the other aperture 18 located on the exposed surface of the wall of via 14 on another side (not necessarily opposite) of channel 15. In other embodiments, fewer or more than two apertures 16, 18 can be employed. In one embodiment, the apertures have the same shape, but in other embodiments the apertures can have different shapes for the same PCB or even the same land.

When mask 20 has been properly registered with respect to PCB 10, a fabricating machine comprising a solder paste screener 30 dispenses an electrically conductive material, such as a mixture of solder and solder flux, to mask 20. The electrically conductive material, represented schematically by dashed arrows 31, goes through apertures 16,18 onto PCB 10.

Figure 3:
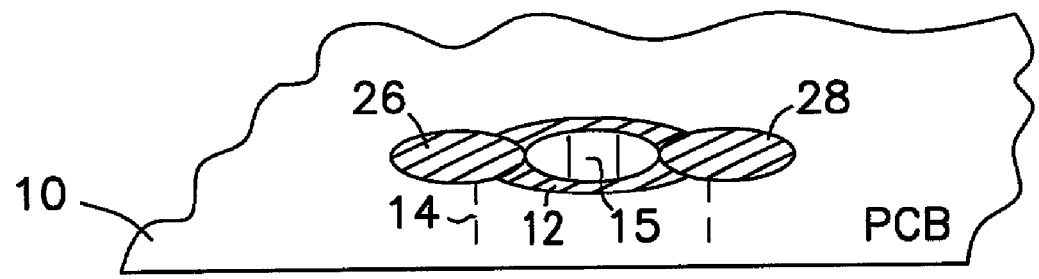
FIG. 3 is a perspective view of a PCB in accordance with one embodiment of the invention.

FIG. 3 is a perspective view of a PCB 10 in accordance with one embodiment of the invention. As a result of the electrically conductive material being dispensed onto PCB 10 through mask 20 (FIG. 2), land 12 has affixed thereto at least one area 26, 28 that comprises a flat, uniformly thick layer of electrically conductive material, and that does not substantially overlie channel 15. That is, the layer of electrically conductive material avoids overlying any substantial portion of channel 15. In one embodiment, two areas 26 and 28 are provided for each land 12, one area 26 being located on one side of channel 15, and the other area 28 located on another side (not necessarily opposite) of channel 15. In other embodiments, fewer or more than two areas 26, 28 can be employed. In an embodiment, the PCB 10 has a planar upper surface, and the area 26 and/or the area 28 may each have planar upper and lower surfaces that are parallel to the upper surface of PCB 10.

Figure 4:
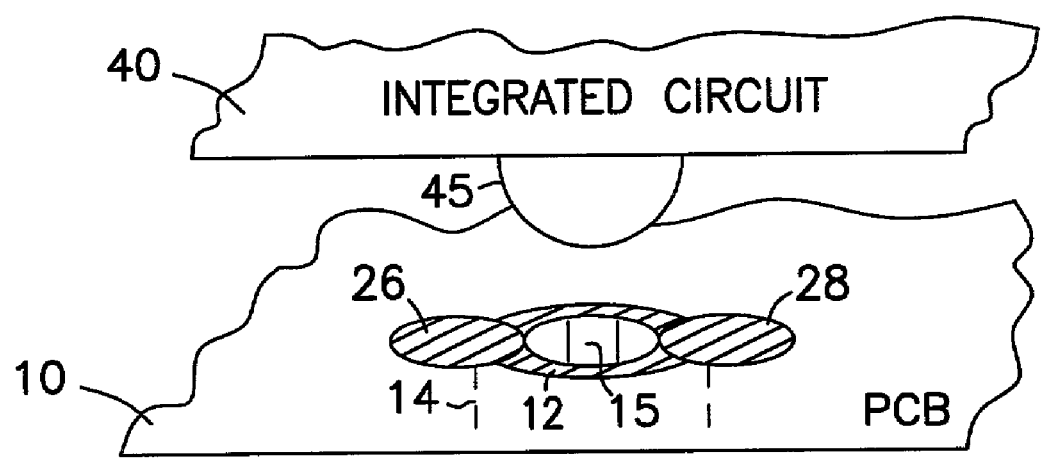
FIG. 4 is a perspective view of an integrated circuit positioned for mounting on a PCB in accordance with one embodiment of the invention.

FIG. 4 is a perspective view of an integrated circuit (IC) 40 positioned for mounting on a PCB 10 in accordance with one embodiment of the invention. PCB 10 and IC 40 form an electronic assembly that can be part of an electronic system. IC 40 can be a surface mount technology component, such as a ball grid array device having at least one ball 45 of electrically conductive material such as solder. When IC 40 is properly registered over PCB 10, ball 45 is positioned over land 12, including solder paste deposits 26 and 28. Ball 45 is then positioned directly on land 12 and affixed to land 12. In one embodiment, ball 45 is affixed to land 12 by heating the electrically conductive material substantially to its melting point, so that ball 45 and areas 26, 28 flow together and become physically and electrically coupled upon cooling.

In one embodiment, the electrically conductive material comprises solder and solder flux. As the solder is being heated to its melting point, the solder flux first substantially reaches its vapor point. If solder and solder flux were allowed to be deposited into channel 15, as the temperature is raised to reflow temperature, the solder flux would first vaporize and expand. The solder flux in the solder paste on the land would melt before the solder flux in the via's channel 15, thus sealing the liquid solder flux in the via. In order for the liquid flux in the via to escape, it would need to overcome the weight of the electrical component as well as the flux seal between the ball and the land. When the ball begins to reflow and bond to the land, the forces required for the flux in the via to escape are exponentially increased. The vaporized flux inside the via tries to escape and can go into the solder ball, causing a ballooning effect that can be very deleterious, because adjacent solder balls can touch and cause an electrical short. The inventive subject matter solves this problem by keeping solder paste out of the channel 15 of via 14.

Figure 5:
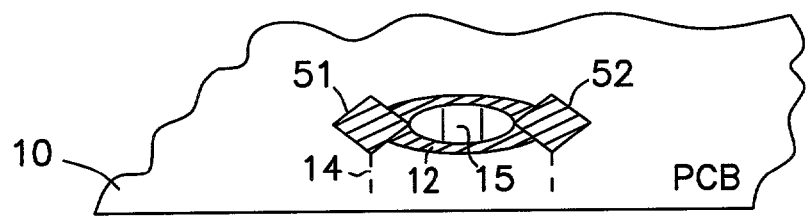
FIG. 5 is a perspective view of a PCB having areas of conductive material in accordance with an alternate embodiment of the invention.

FIG. 5 is a perspective view of a PCB 10 having areas 51, 52 of conductive material in accordance with an alternate embodiment of the invention. Areas 51 and 52 are shaped like squares or diamonds.

Figure 6:
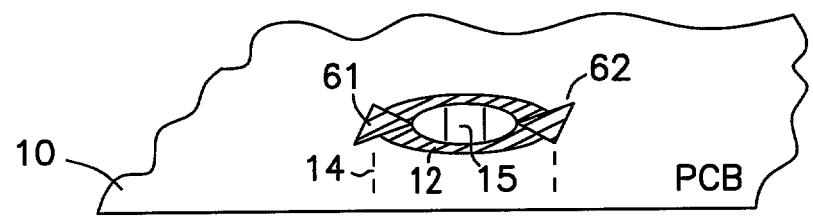
FIG. 6 is a perspective view of a PCB having areas of conductive material in accordance with another alternate embodiment of the invention.

FIG. 6 is a perspective view of a PCB 10 having areas 61, 62 of conductive material in accordance with another alternate embodiment of the invention. Areas 61 and 62 are triangular in shape.

Figure 7:
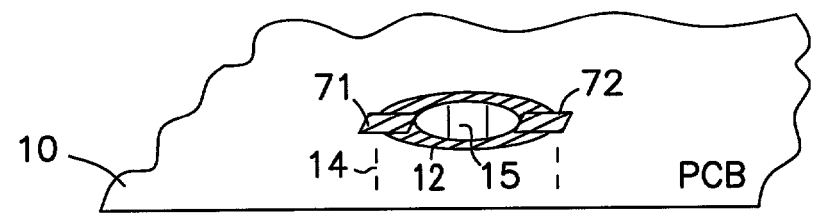
FIG. 7 is a perspective view of a PCB having areas of conductive material in accordance with yet another alternate embodiment of the invention.

FIG. 7 is a perspective view of a PCB 10 having areas 71, 72 of conductive material in accordance with yet another alternate embodiment of the invention. Areas 71 and 72 are rectangular in shape.

Figure 8:
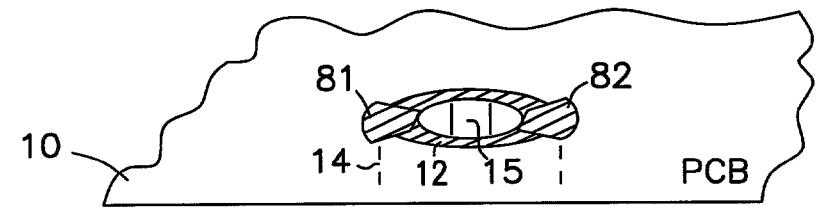
FIG. 8 is a perspective view of a PCB having areas of conductive material in accordance with a further alternate embodiment of the invention.

FIG. 8 is a perspective view of a PCB 10 having areas 81, 82 of conductive material in accordance with a further alternate embodiment of the invention. Areas 81 and 82 are free-form in shape and can be of any appropriate shape that achieves a reliable connection between the electrical contacts of the component and the corresponding lands.

In FIGS. 5–8, areas 51, 52, 61, 62, 71, 72, 81, and 82 can be positioned in any suitable orientation, and they do not necessarily have to be positioned as shown in the illustrations.

Figure 9:
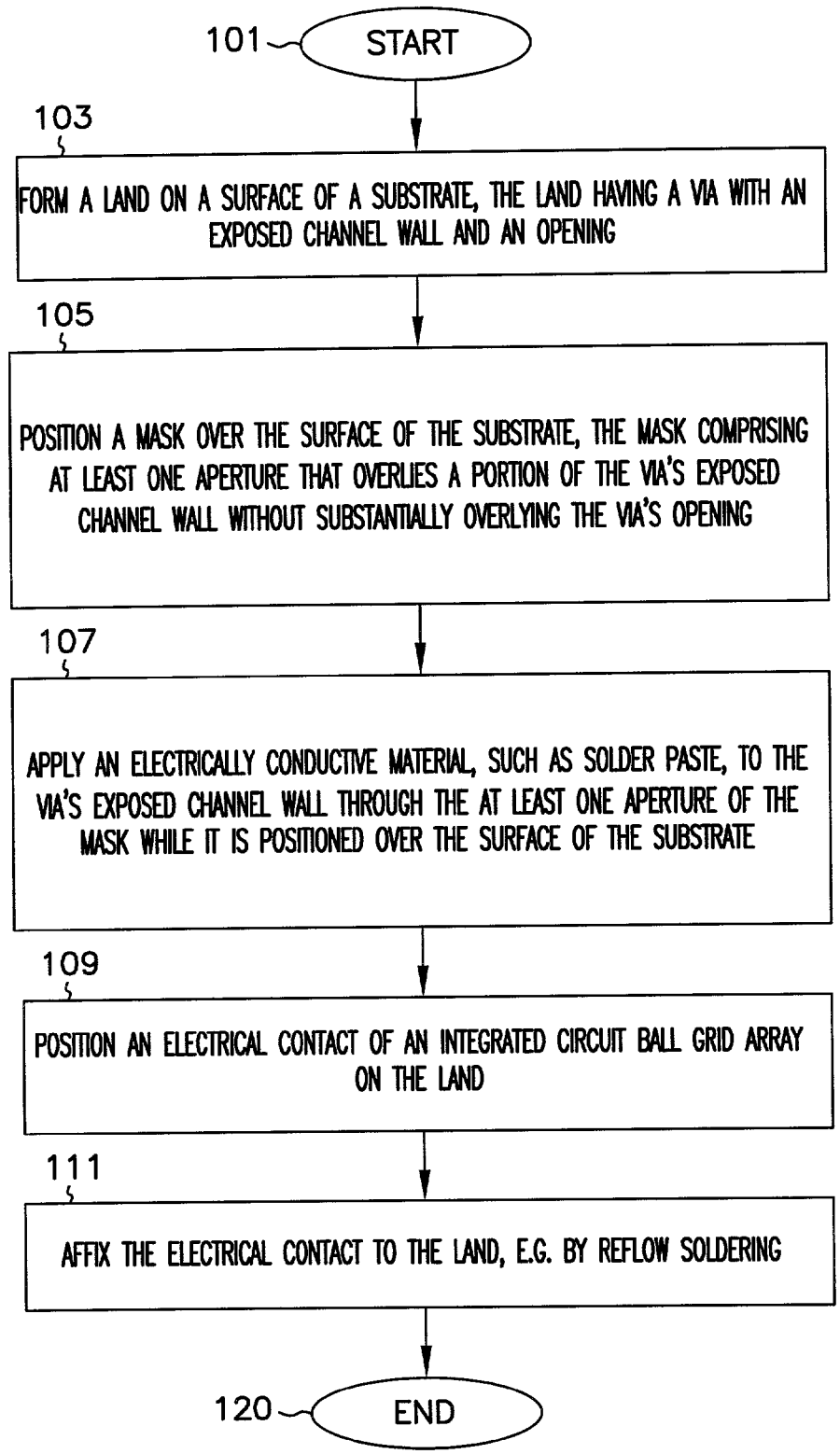
FIG. 9 is a flow diagram of a method of fabricating an electronic assembly that includes coupling an integrated circuit to a PCB with a pad having a via, in accordance with one embodiment of the invention.

FIG. 9 is a flow diagram of a method of fabricating an electronic assembly that includes coupling an integrated circuit to a PCB with a pad having a via, in accordance with one embodiment of the invention. The method begins in 101.

In 103, a land is formed on a surface of a substrate, such as a PCB. The land has a via having an exposed channel wall and an opening. The via is formed in the PCB through conventional techniques. The exposed surface of the via can function as the land.

In 105, a mask is positioned over the surface of the substrate. The mask comprises at least one aperture that overlies a portion of the via's exposed channel wall without substantially overlying the via's channel or opening.

In 107, an electrically conductive material, such as solder paste, is applied to the via's exposed channel wall through the at least one aperture of the mask while it is positioned over the surface of the substrate.

In 109, an electrical contact of an IC ball grid array is positioned on the land.

In 111, the electrical contact is affixed to the land. This can be accomplished, for example, by reflow soldering. The method ends in 120.

PCB 10 can be any type of electrical substrate on which electrical components can be mounted, such as a material formed of polyimide, a suitable organic material, silicon, glass, quartz, ceramic, and the like.

The electrical component that is mounted to PCB 10 can be of any type, such as an IC or other semiconductor device; a passive element such as an inductor, capacitor, or resistor; or any other kind of electrical or electronic device. IC 40 can be of any type, such as a microprocessor or microcontroller, memory circuit, application specific integrated circuit (ASIC), digital signal processor (DSP), a radio frequency circuit, an amplifier, a power converter, a filter, a clocking circuit, and the like.

The inventive subject matter conserves valuable PCB "real estate" by utilizing lands comprising vias, while at the same time providing satisfactory reliability of the solder connections between the electrical contacts of electronic component packages, such as surface mount technology components, e.g. ball grid array devices, and corresponding lands on the PCB. If solder were permitted to be screened into the via channels, a significant problem can occur in the form of solder flux vaporizing and expanding into solder balls to the extent that adjoining solder balls can come into contact with each other. Among other advantages, the inventive subject matter solves this problem by preventing solder and solder flux from entering into the via channels in the lands.

As shown herein, the inventive subject matter can be implemented in a number of different embodiments, including a method for fabricating an electronic assembly, an IC package, a mask for use in fabricating an IC package, a machine for fabricating an electronic assembly, an improved substrate or PCB, and an electronic system.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the inventive subject matter. Therefore, it is manifestly intended that embodiments of the inventive subject matter be limited only by the claims and the equivalents thereof.

What is claimed is:

1. A method for fabricating an electronic assembly, wherein the electronic assembly is to receive an integrated circuit package comprising a ball grid array of electrical contacts, the method comprising:
   forming a land on a surface of a printed circuit board substrate, the land having a via with an exposed channel wall and an opening;
   positioning a mask over the surface of the substrate, the mask comprising at least one aperture that overlies a portion of the exposed channel wall without substantially overlying the opening;
   applying an electrically conductive material to the portion of the exposed channel wall through the at least one aperture of the mask while it is positioned over the surface of the substrate to form at least one flat, uniformly thick land area;
   positioning one of the electrical contacts directly on the land, including the at least one land area; and
   affixing the one of the electrical contacts to the land.

2. The method recited in claim 1 wherein, in the positioning operation, the at least one aperture has a geometry from the group consisting of a circle, an ellipse, a polygon, and a free-form shape.

3. The method recited in claim 1 wherein, in the forming operation, the via extends into the substrate.

4. The method recited in claim 1 wherein affixing comprises heating the electrically conductive material substantially to its melting point.

5. The method recited in claim 4 wherein, in the applying operation, the electrically conductive material is mixed with flux, and wherein affixing comprises heating the flux substantially to its vapor point.

6. A method comprising:
   forming a land on a planar upper surface of a substrate, the land having a through-hole with an exposed wall and an opening;
   positioning a stencil over the surface of the substrate, the stencil comprising at least one aperture that overlies a portion of the exposed wall without substantially overlying the opening;
   applying an electrically conductive material to the portion of the exposed wall through the at least one aperture of the stencil while it is positioned over the surface of the substrate to form at least one flat land area, the land area having planar upper and lower surfaces that are parallel to the upper surface of the substrate;
   wherein the substrate is to receive an integrated circuit package comprising a ball grid array of electrical contacts, and wherein the method further includes
   positioning one of the electrical contacts on the land, including the at least one land area; and affixing the one of the electrical contacts to the land.

7. The method recited in claim 6 wherein, in the positioning operation, the at least one aperture has a geometry from the group consisting of a circle, an ellipse, a polygon, and a free-form shape.

8. The method recited in claim 6 wherein, in the forming operation, the through-hole extends into the substrate.

9. The method recited in claim 6 wherein affixing comprises heating the electrically conductive material substantially to its melting point.

10. The method recited in claim 9 wherein, in the applying operation, the electrically conductive material is mixed with flux, and wherein affixing comprises heating the flux substantially to its vapor point.

11. The method recited in claim 6 wherein, in the positioning operation, the stencil comprises two apertures, and wherein, in the applying operation, the electrically conductive material is applied to the portion of the exposed wall through the two apertures of the stencil while it is positioned over the surface of the substrate.

12. The method recited in claim 6 wherein, in the applying operation, the electrically conductive material comprises solder.

13. A method comprising:
    forming a bonding pad on a surface of a printed circuit board (PCB), the bonding pad having a through-hole with an exposed wall and an opening;
    positioning a stencil over the surface of the PCB, the stencil comprising at least one aperture that overlies a portion of the exposed wall without substantially overlying the opening; and
    applying an electrically conductive material to the portion of the exposed wall through the at least one aperture of the stencil while it is positioned over the surface of the PCB to form at least one flat, uniformly thick bonding pad area;
    wherein the PCB is to receive an integrated circuit package comprising a plurality of terminals, and wherein the method further includes
    positioning one of the terminals on the bonding pad, including the at least one bonding pad area; and
    affixing the one of the terminals directly to the bonding pad.

14. The method recited in claim 13 wherein, in the positioning operation, the at least one aperture has a geometry from the group consisting of a circle, an ellipse, a polygon, and a free-form shape.

15. The method recited in claim 13 wherein, in the forming operation, the through-hole extends into the PCB.

16. The method recited in claim 13 wherein affixing comprises heating the electrically conductive material substantially to its melting point.

17. The method recited in claim 16 wherein, in the applying operation, the electrically conductive material is mixed with flux, and wherein affixing comprises heating the flux substantially to its vapor point.

18. The method recited in claim 13 wherein, in the positioning operation, the stencil comprises two apertures, and wherein, in the applying operation, the electrically conductive material is applied to the portion of the exposed wall through the two apertures of the stencil while it is positioned over the surface of the PCB.

19. The method recited in claim 13 wherein, in the applying operation, the electrically conductive material comprises solder.

* * * * *